US006982464B2

(12) United States Patent
Achuthan et al.

(10) Patent No.: US 6,982,464 B2
(45) **Date of Patent: *Jan. 3, 2006**

(54) DUAL SILICON LAYER FOR CHEMICAL MECHANICAL POLISHING PLANARIZATION

(75) Inventors: Krishnashree Achuthan, San Ramon, CA (US); Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/975,473

(22) Filed: Oct. 29, 2004

(65) Prior Publication Data

US 2005/0056845 A1 Mar. 17, 2005

Related U.S. Application Data

(60) Continuation of application No. 10/752,691, filed on Jan. 8, 2004, now Pat. No. 6,812,076, which is a division of application No. 10/459,579, filed on Jun. 12, 2003, now Pat. No. 6,756,643.

(51) Int. Cl.
*H01L 29/72* (2006.01)

(52) U.S. Cl. ...................... 257/368; 257/347; 257/365; 257/366

(58) Field of Classification Search ................ 257/347, 257/365, 366, 368
See application file for complete search history.

(56) References Cited

U.S. PATENT DOCUMENTS

| | | | | |
|---|---|---|---|---|
| 6,611,029 | B1 | 8/2003 | Ahmed et al. | 257/365 |
| 6,642,090 | B1 | 11/2003 | Fried et al. | 438/164 |
| 6,645,797 | B1 | 11/2003 | Buynoski et al. | 438/157 |
| 6,689,650 | B2 | 2/2004 | Gambino et al. | 438/157 |
| 6,756,643 | B1 * | 6/2004 | Achuthan et al. | 257/365 |
| 2001/0036731 | A1 | 11/2001 | Muller et al. | 438/689 |
| 2002/0130354 | A1 | 9/2002 | Sekigawa et al. | 257/315 |
| 2002/0177263 | A1 | 11/2002 | Hanafi et al. | 438/183 |
| 2003/0057486 | A1 | 3/2003 | Gambino et al. | 257/347 |

OTHER PUBLICATIONS

Digh Hisamoto et al.: "FinFET—A Self-Aligned Double-Gate MOSFET Scalable to 20 nm," IEEE Transactions on Electron Devices, vol. 47, No. 12, Dec. 2000, pp. 2320-2325.
Yang-Kyu Choi et al.: "Sub-20nm CMOS Fin FET Technologies," 0-7803-5410-9/99 IEEE, Mar. 2001, 4 pages.
Xuejue Huang et al.: "Sub-50 nm P-Channel Fin FET," IEEE Transactions on Electron Devices, vol. 48, No. 5, May 2001, pp. 880-886.
Yang-Kyu Choi et al.: "Nanoscale CMOS Spacer FinFET for the Terabit Era," IEEE Electron Device Letters, vol. 23, No. 1, Jan. 2002, pp. 25-27.
Xuejue Huang et al.: "Sub 50-nm FinFET: PMOS," 0-7803-7050-3/01 IEEE, Sep. 1999 4 pages.

* cited by examiner

*Primary Examiner*—Edward Wojciechowicz
(74) *Attorney, Agent, or Firm*—Harrity & Snyder LLP

(57) ABSTRACT

A FinFET-type semiconductor device includes a fin structure on which a relatively thin amorphous silicon layer and then an undoped polysilicon layer is formed. The semiconductor device may be planarized using a chemical mechanical polishing (CMP) in which the amorphous silicon layer acts as a stop layer to prevent damage to the fin structure.

10 Claims, 12 Drawing Sheets

DUAL SILICON LAYER FOR CHEMICAL MECHANICAL POLISHING PLANARIZATION

RELATED APPLICATIONS

This application is a continuation application under 37 C.F.R. § 1.53(b) of application Ser. No. 10/752,691, filed Jan. 8, 2004, U.S. Pat. No. 6,812,076 which is a divisional application of application Ser. No. 10/459,579, filed Jun. 12, 2003, U.S. Pat. No. 6,756,643 for "DUAL SILICON LAYER FOR CHEMICAL MECHANICAL POLISHING PLANARIZATION," the contents of which are incorporated herein.

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the present invention provide a double-gate MOSFET having a dual polysilicon layer over the gate area that is used to enhance chemical mechanical polishing (CMP) planarization of the polysilicon.

One implementation consistent with the invention provides a method of manufacturing a semiconductor device. The method includes forming a fin structure on an insulator and forming a gate structure over at least a portion of the fin structure and a portion of the insulator. The gate structure includes a first layer and a second layer formed over the first layer. The method further includes planarizing the gate structure by performing a chemical-mechanical polishing (CMP) of the gate structure. The planarization rate of the first layer of the gate structure may be slower than that of the second layer of the gate structure. The planarization continues until the first layer is exposed in an area over the fin.

An alternate implementation consistent with the invention is directed to a semiconductor device. The device includes a fin structure formed over an insulator. The fin structure includes first and second ends. At least a portion of the fin structure acts as a channel in the semiconductor device. An amorphous silicon layer is formed over at least a portion of the fin structure. A polysilicon layer is formed around at least the portion of the amorphous silicon layer. The amorphous silicon layer protrudes through the polysilicon layer in an area over the fin structure. A source region is connected to the first end of the fin structure. A drain region is connected to the second end of the fin structure.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET, as the term is used herein, refers to a type of MOSFET in which a conducting channel is formed in a vertical Si "fin." FinFETs are generally known in the art.

Figure 1:
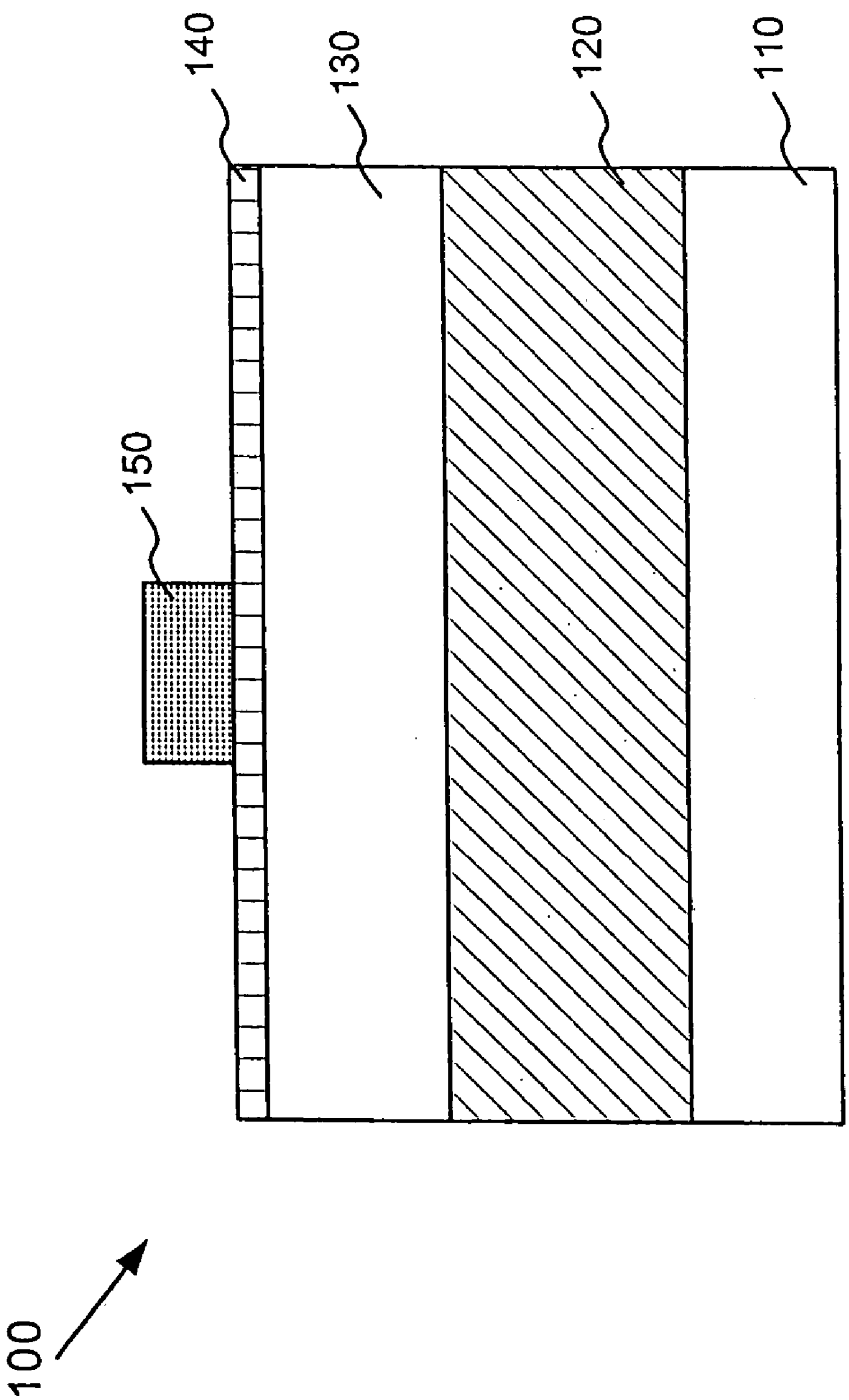
FIG. 1 is a diagram illustrating the cross-section of an exemplary semiconductor device.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer A (e.g., $SiO_2$), may be formed over silicon layer 130 to act as a protective cap during subsequent etching processes. In an exemplary implementation, dielectric layer 140 may be grown to a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions. In other implementations, silicon layer 130 may be patterned and etched to form source and drain regions simultaneously with the fin.

Figure 2A:
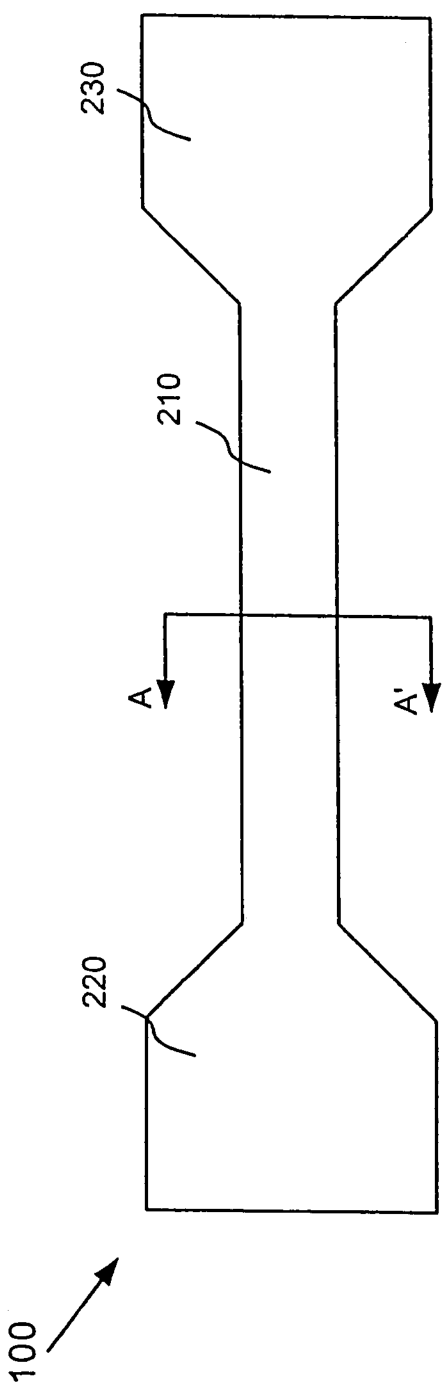
FIG. 2A is a diagram illustrating the top view of a fin structure formed on the semiconductor device shown in FIG. 1.

FIG. 2A schematically illustrates the top view of a fin structure on semiconductor device 100 formed in such a manner. Source region 220 and drain region 230 may be formed adjacent the ends of fin structure 210 on buried oxide layer 120, according to an exemplary embodiment of the present invention.

Figure 2B:
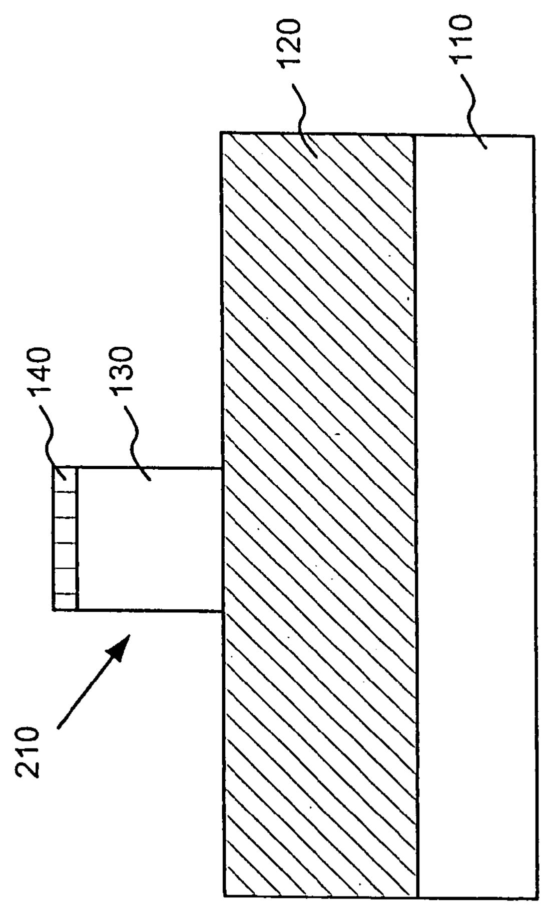
FIG. 2B is a diagram illustrating a cross-section along line A–A' in FIG. 2A.

FIG. 2B is a cross-section along line A–A' in FIG. 2A illustrating the formation of fin structure 210. As described above, dielectric layer 140 and silicon layer 130 may be etched to form fin structure 210 comprising a silicon fin 130 with a dielectric cap 140.

Figure 3:
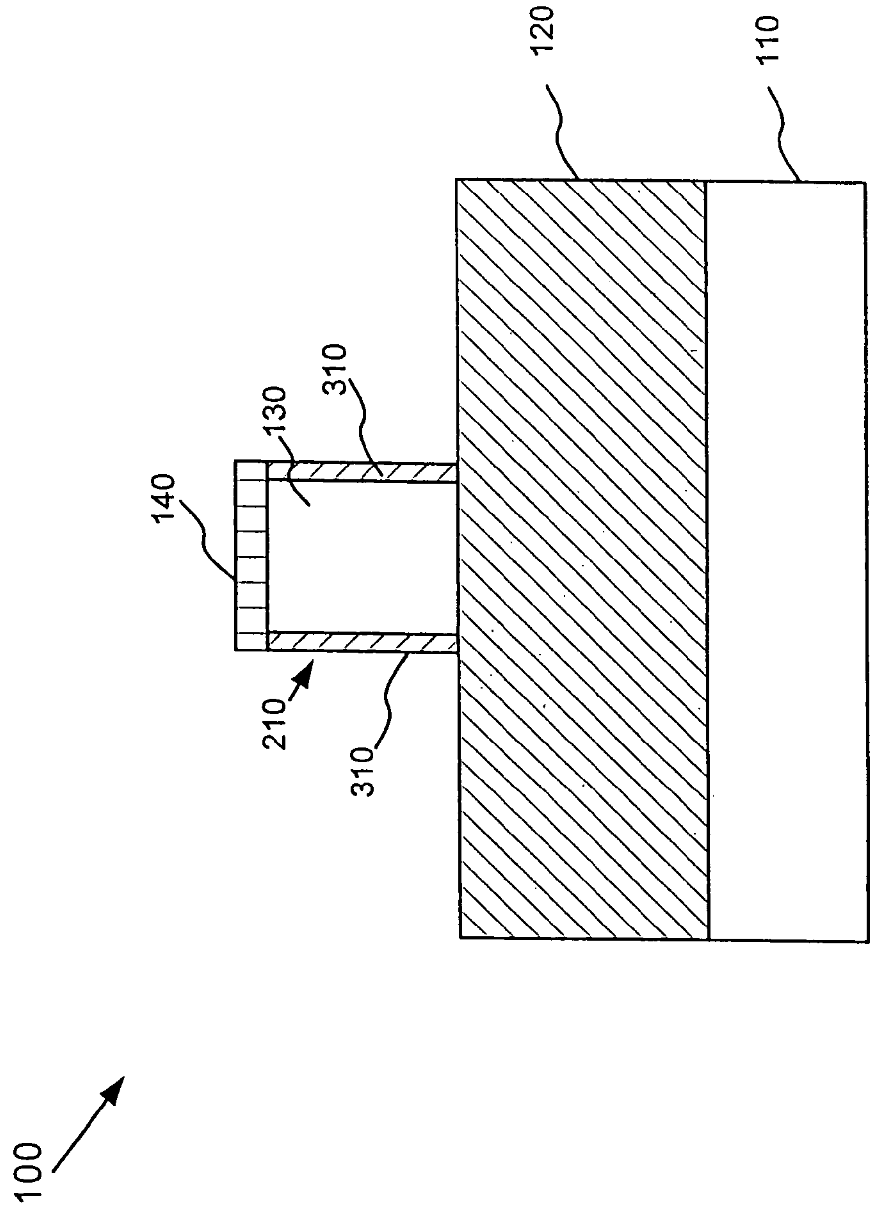
FIG. 3 is a diagram illustrating a cross-section of a gate dielectric layer formed on the fin shown in FIG. 2B.

FIG. 3 is a cross-section illustrating the formation of a gate dielectric layer and gate material over fin structure 210 in accordance with an exemplary embodiment of the present invention. A dielectric layer may be formed on the exposed side surfaces of silicon fin 130. For example, a thin oxide film 310 may be thermally grown on fin 130, as illustrated in FIG. 3. The oxide film 310 may be grown to a thickness of about 50 Å to about 100 Å and may be formed on the exposed side surfaces of fin 130.

Figure 4:
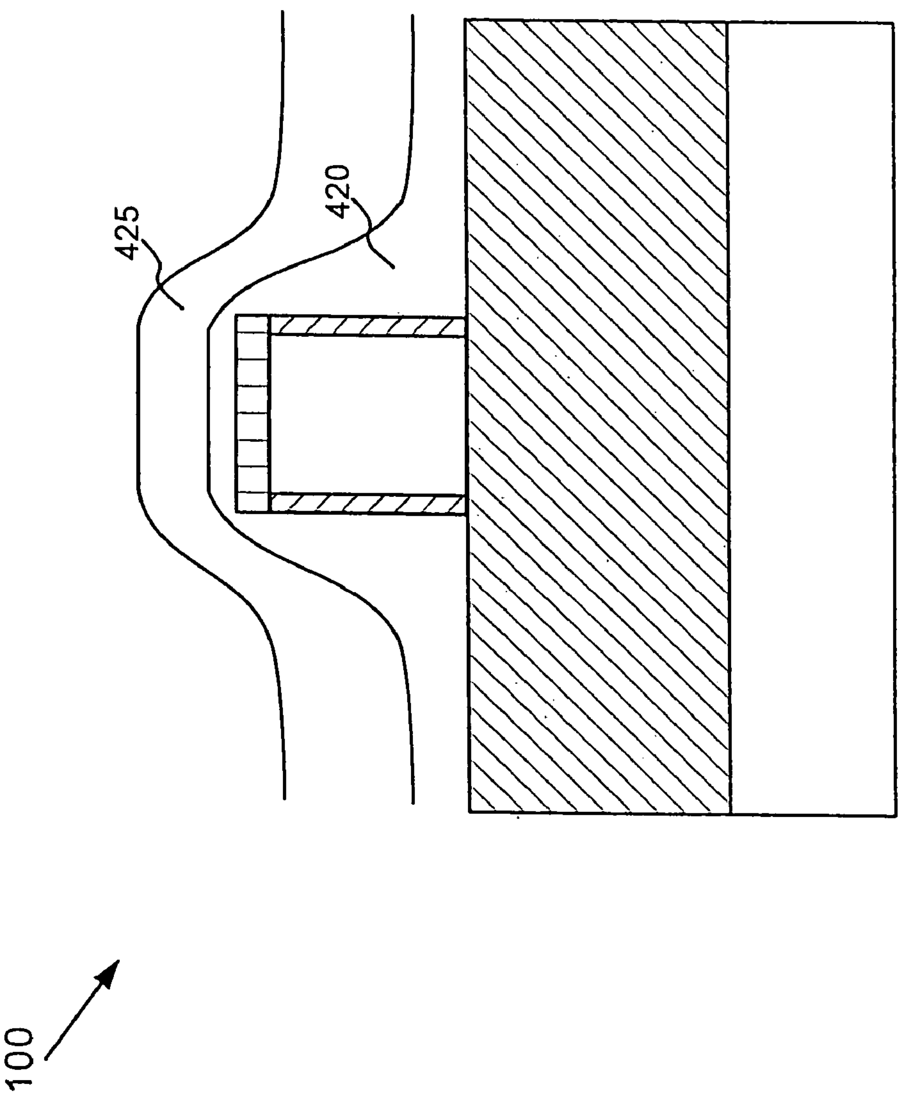
FIG. 4 is a diagram illustrating a cross-section showing gate material layers deposited over the fin shown in FIG. 3.

Gate material layer(s) may be deposited over semiconductor device 100 after formation of the oxide film 310. Referring to FIG. 4, the gate material layers may include a thin layer of amorphous silicon 420 followed by a layer of undoped polysilicon 425. Layers 420 and 425 may be deposited using conventional chemical vapor deposition (CVD) or other well known techniques. Amorphous silicon layer 420 may be deposited to a thickness of approximately 300 Å. More particularly, amorphous silicon layer 420 may be deposited to a thickness ranging from about 200 Å to 600 Å. Polysilicon layer 425 may be deposited to a thickness ranging from about 200 Å to 1000 Å. The thicknesses will vary depending on the fin or stack height.

Layers 420 and 425, and in particular, layer 425, may next be planarized. Consistent with an aspect of the invention, gate material layers 420 and 425 may be planarized in a planarization process that takes advantage of the different polishing rates of amorphous silicon layer 420 and polysilicon layer 425. More specifically, by using the differences between polishing rates of the amorphous silicon layer 420 and polysilicon layer 425, a controlled amount of amorphous layer 420 can be retained on fin 210.

CMP is one know planarization technique that may be used to planarize a semiconductor surface. In CMP processing, a wafer is placed face down on a rotating platen. The wafer, held in place by a carrier, rotates in the same direction of the platen. On the surface of the platen is a polishing pad on which there is a polishing slurry. The slurry may include a colloidal solution of silica particles in a carrier solution. The chemical composition and pH of the slurry affects the performance of the CMP process. In an exemplary implementation of the invention, the particular slurry is chosen to have a low rate of polishing for amorphous silicon as compared to polysilicon. Slurries for CMP are well known in the art and are generally available. Many of the commercially available slurries that are used for oxide CMP with abrasives such as silica particles can be chemically modified to polish a-Si and poly-Si at different rates. The pH of the slurry may vary from 7–12. The removal rates can be varied from 50 A/min to 2000 A/min for a-Si and 500 A/min to 6000 A/min for poly Si.

Figure 5:
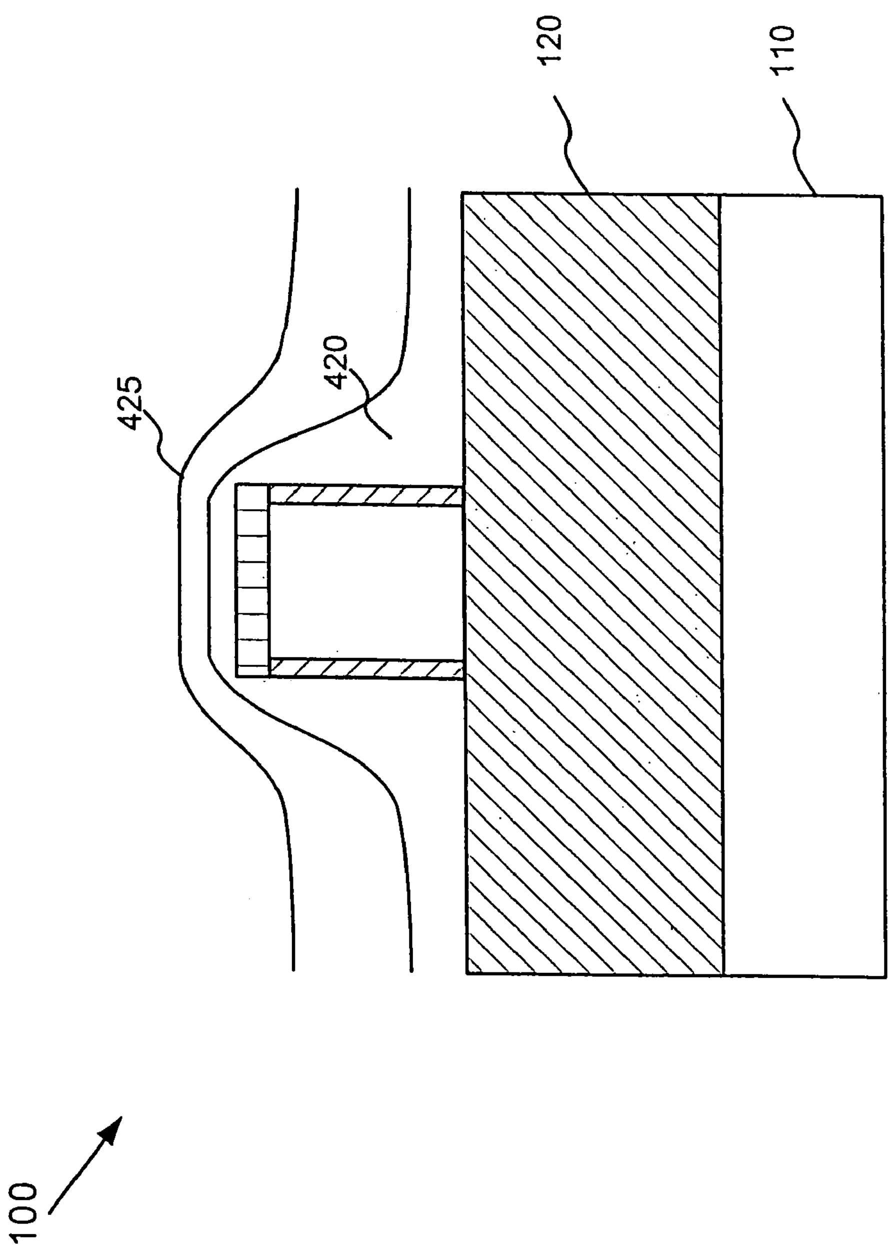
FIG. 5 is a diagram illustrating a cross-section showing the gate material layers of FIG. 4 after an initial planarization.
Figure 6:
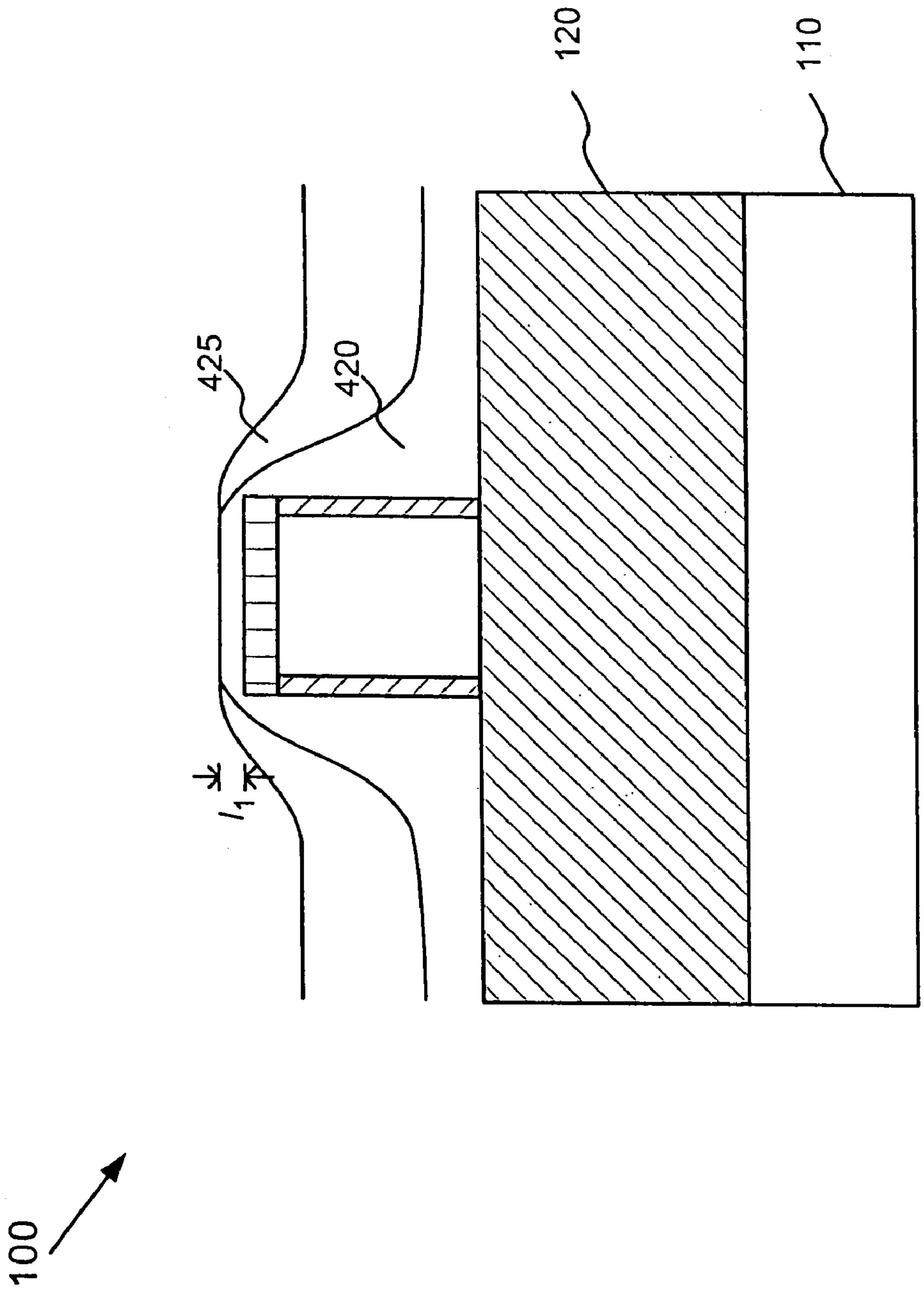
FIG. 6 is a diagram illustrating a cross-section showing the gate material layers of FIG. 5 after further planarization.

FIG. 5 is a cross-section illustrating the planarizing of the gate material layers 420 and 425 after an initial period of planarization has been completed. As shown in FIG. 5, polysilicon layer 425 has initially been planarized such that the extrusion of polysilicon layer 425 above fin 210 has been reduced. FIG. 6 illustrates semiconductor device 100 after further CMP processing. At this point, the upper surface of amorphous silicon layer 420 may be exposed in the area above fin 210. Because the CMP process has a relatively slow rate of polishing for amorphous silicon layer 420 compared to polysilicon layer 425, amorphous silicon layer 420 effectively acts as an automatic stop layer and will remain as a protective layer over fin 210. It should be understood that a small portion of amorphous silicon layer 420 may also be removed during the CMP. In this manner, amorphous silicon layer 420 may be used as a protective stopping layer for fin 210 when planarizing gate layer 420 and 425. The final thickness of amorphous silicon layer 420 extending above fin 210, shown in FIG. 6 as distance $l_1$, may be, for example, approximately 300 Å.

Figure 7:
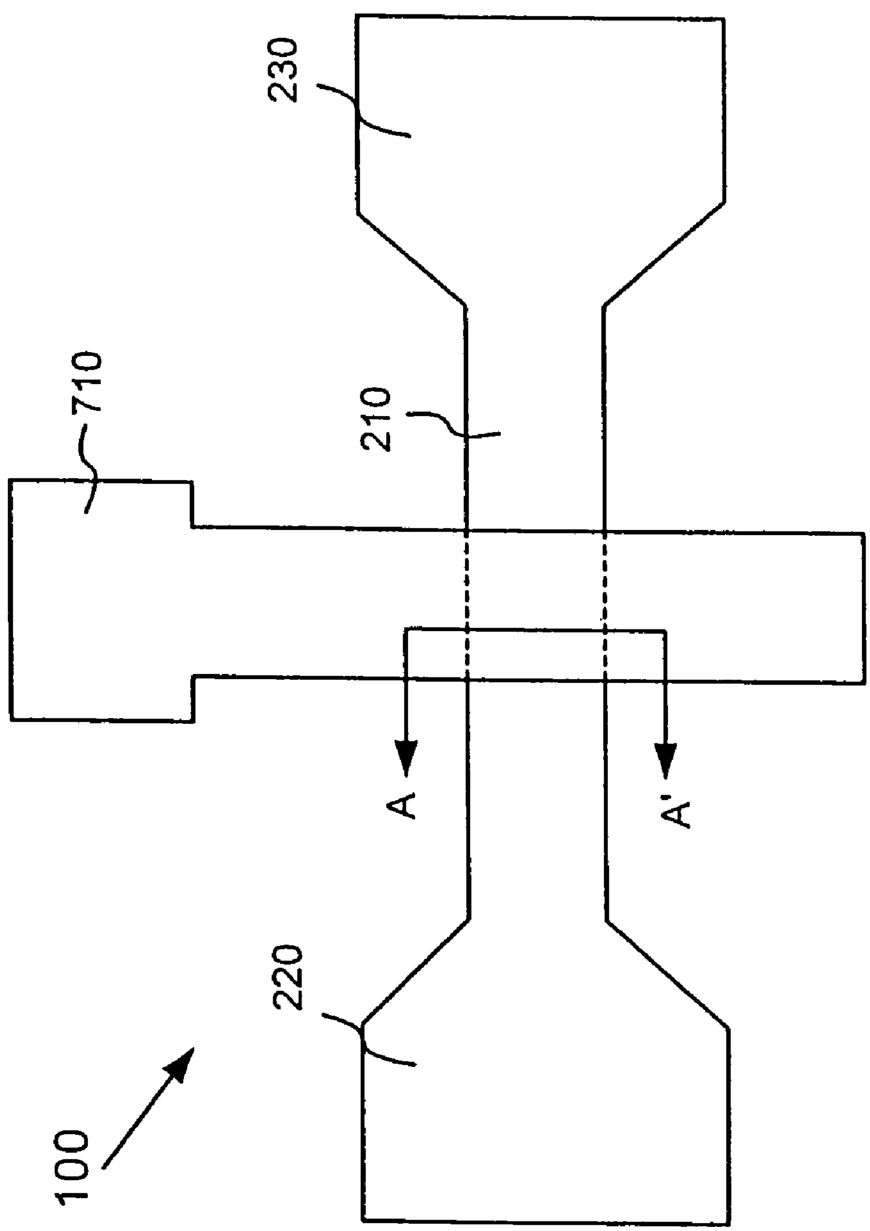
FIG. 7 is a diagram schematically illustrating a top view of a FinFET showing a gate structure patterned from the gate material shown in FIG. 6.

FIG. 7 schematically illustrates the top view of semiconductor device 100 illustrating a gate structure 710 patterned from gate material layers 420 and 425. Gate structure 710 may be patterned and etched after the CMP process is completed. Gate structure 710 extends across a channel region of the fin 210. Gate structure 710 may include a gate portion proximate to the sides of the fin 210 and a larger electrode portion spaced apart from the fin 210. The electrode portion of gate structure 710 may provide an accessible electrical contact for biasing or otherwise controlling the gate portion.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

OTHER IMPLEMENTATIONS

The CMP planarization process described above planarizes the gate material layer to form a uniform surface for semiconductor device 100. In some implementations, to further improve the planarization process, dummy fin structures may be additionally placed next to fin 210 to help yield an even more uniform layer.

Figure 8:
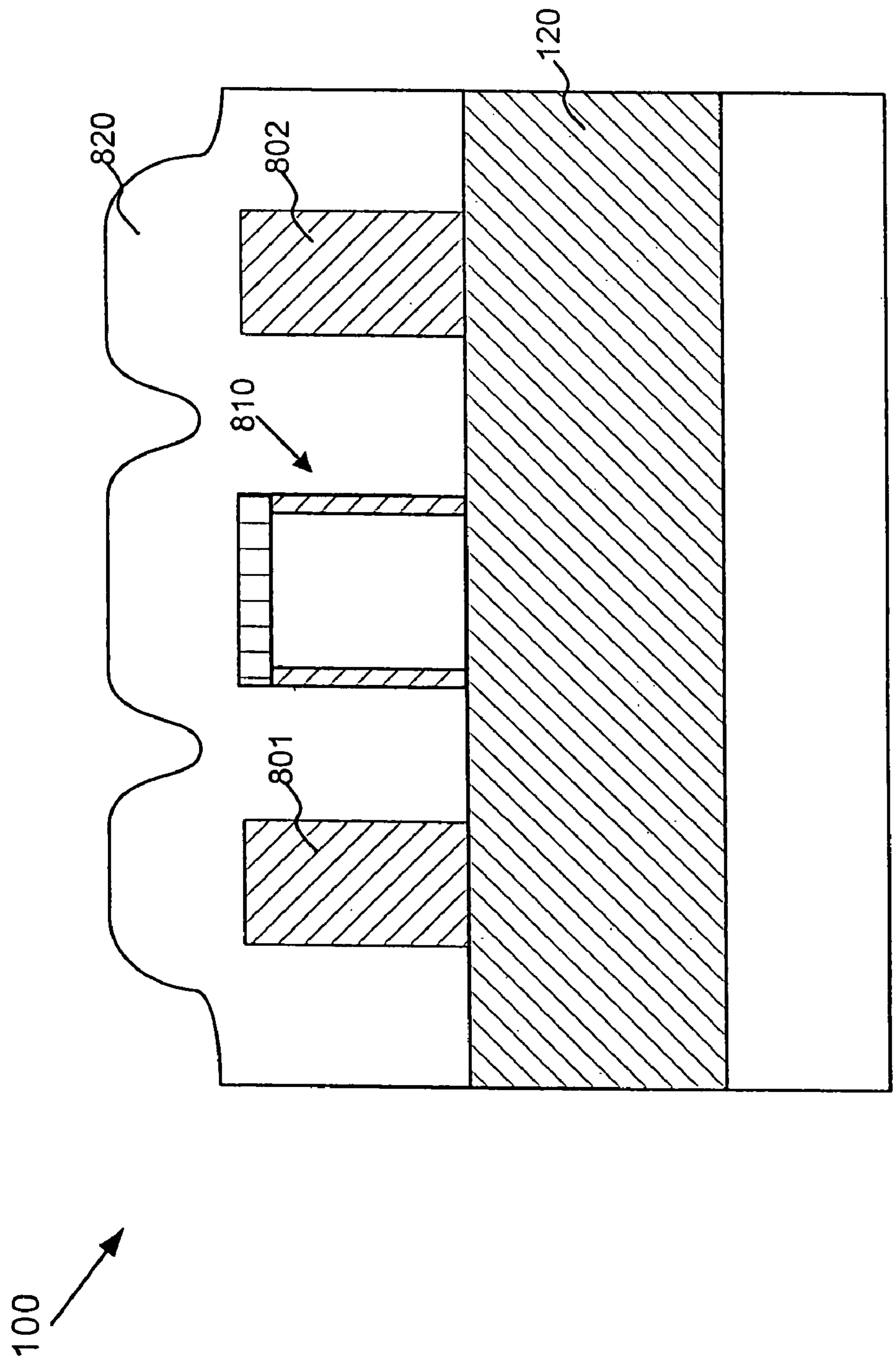
FIG. 8 is a diagram illustrating a cross-section showing dummy fins.

FIG. 8 is a cross-sectional diagram illustrating dummy fins. FIG. 8 is generally similar to the cross-section shown in FIG. 4, except in FIG. 8, dummy fins 801 and 802 have been formed next to the actual fin 810. Dummy fins 801 and 802 do not play a role in the final operation of the FinFET. However, by placing fins 801 and 802 next to fin 810, gate material layer 820 may form a more uniform distribution when it is initially deposited. That is, dummy fins 801 and 802 cause the low point in layer 820 to be higher in the areas adjacent fin 810 than if dummy fins 801 and 802 were not present. Thus, in the implementation shown in FIG. 8, layer 820 starts off more uniform than without dummy fins 801 and 802. This can lead to better uniformity after planarization.

Figure 9:
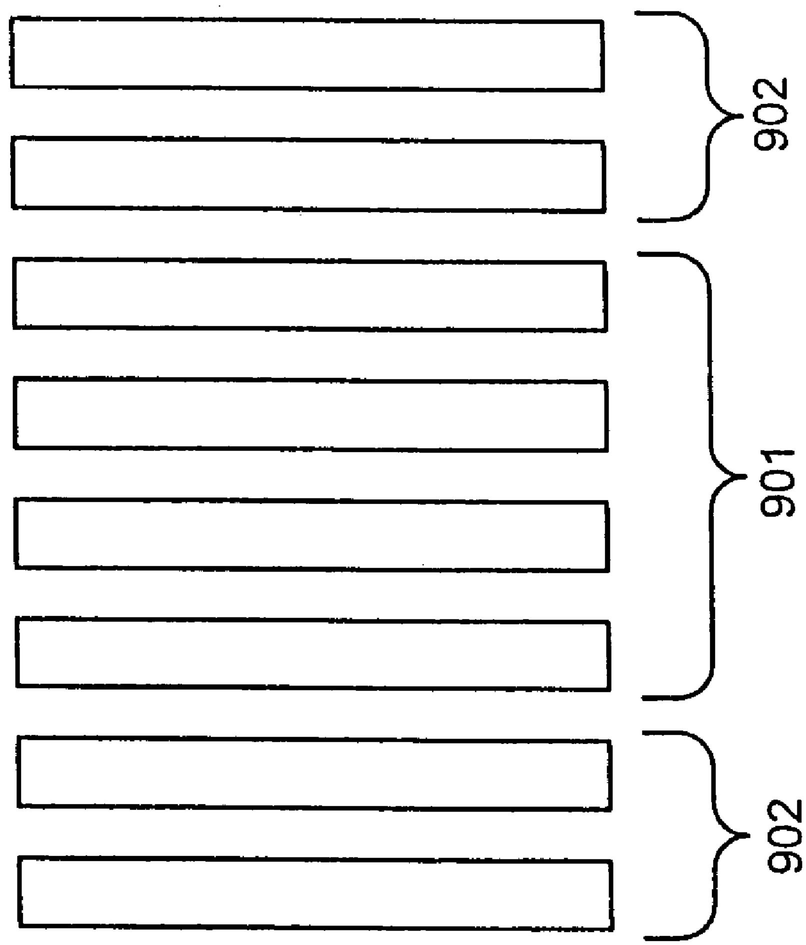
FIG. 9 is a diagram conceptually illustrating an array of lines, including dummy structures, on a semiconductor device.

FIG. 9 is a diagram conceptually illustrating an array of lines (e.g., fins) on a semiconductor device. Lines 901 may represent fins that are actually used in the FinFETs. Lines 902 represent dummy fins at the ends of lines 901. Dummy fins 902 help to compensate for erosion effects caused by the CMP process, thus potentially yielding a more uniform planarized surface.

Figure 10:
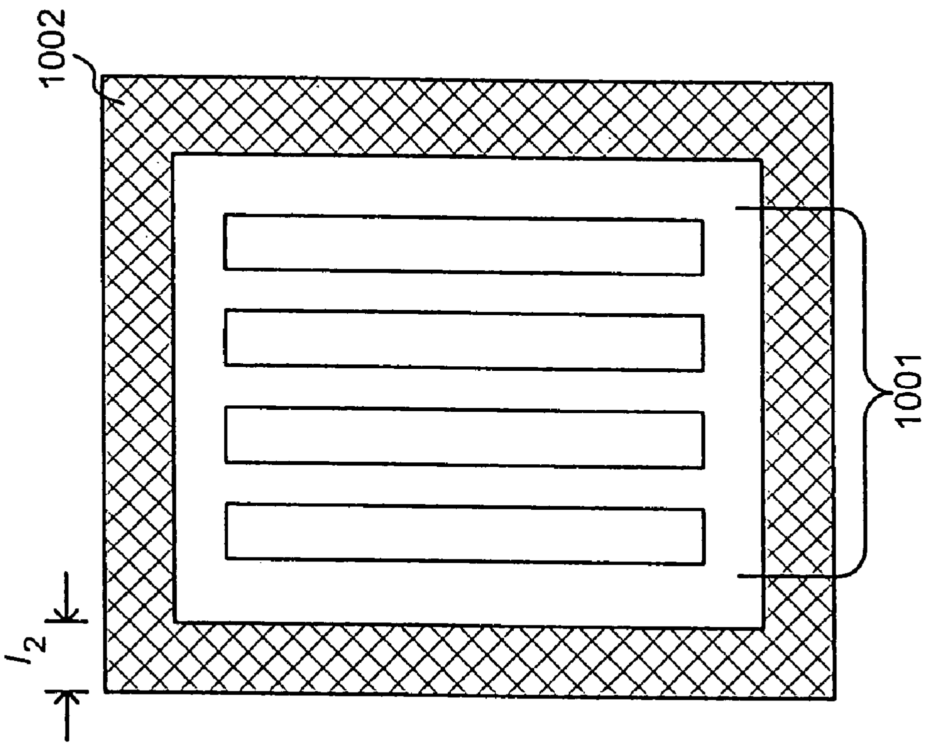
FIG. 10 is a diagram conceptually illustrating an alternate dummy structure on a semiconductor device.

FIG. 10 is a diagram conceptually illustrating an alternate implementation of a dummy structure. Lines 1001 may be similar to lines 901, and represent actual structures used in the final semiconductor device. Dummy lines 901, however, are replaced by dummy structure 1002. Dummy structure 1002 encompasses more area than dummy lines 902 and may provide better uniformity during planarization. In particular, by encapsulating the pattern of lines 1001, dummy structure 1002 may protect and prevent lines 1001 from non-uniform polishing. The dimension of dummy structure 1002, such as length $l_2$, may depend on the overall pattern density being used on the semiconductor device.

In an additional implementation involving the CMP planarization process, described below with reference to FIGS. 11–14, CMP induced detrimental effects for metal gate integration layers may be reduced.

Figure 11:
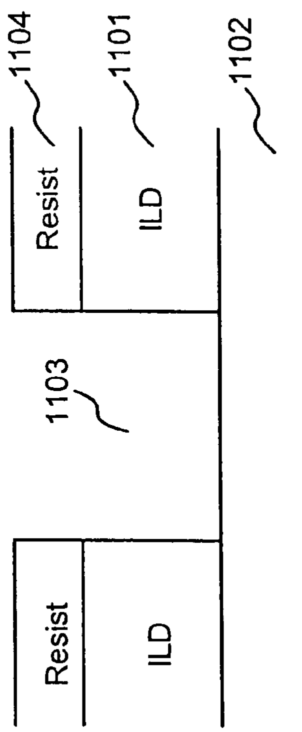
FIGS. 11–14 are diagrams illustrating cross-sections that show the formation of vias.

Interlayer dielectric (ILD) layers may be used in semiconductor devices when creating vertically stacked layers of semiconductor logic. As shown in FIG. 11, an ILD layer 1101 may be used to separate a first semiconductor logic layer 1102 from a second semiconductor logic layer that will later be formed above ILD layer 1101. Layer 1102 is not shown in detail in FIG. 11, but may include, for example, numerous interconnected FinFETs that perform one or more logic functions.

Vias 1103 may be patterned in ILD layer 1101 by application of resist 1104. Vias 1103 may be filled (shown in FIGS. 12–14) with a conducting material that allows the layers to communicate with one another.

Figure 12:
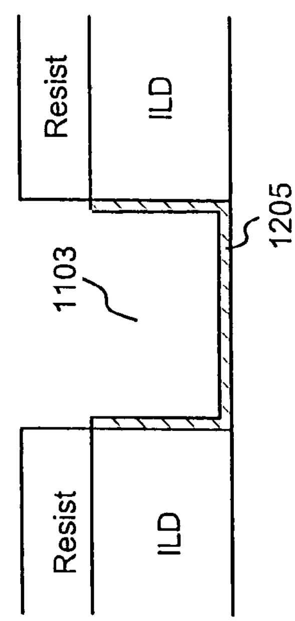

Referring to FIG. 12, via 1103 may be implanted in the area around ILD 1101. Implantation material 1205 may include silicon (Si) or Palladium (Pd) that function as activators for the subsequently deposited metal. Other materials that function as activators for electroless deposition of metals may be used.

Figure 13:
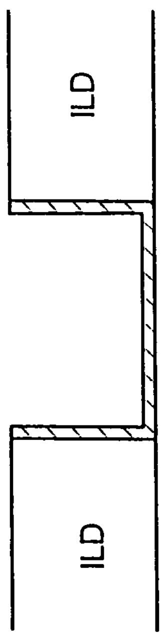
Figure 14:
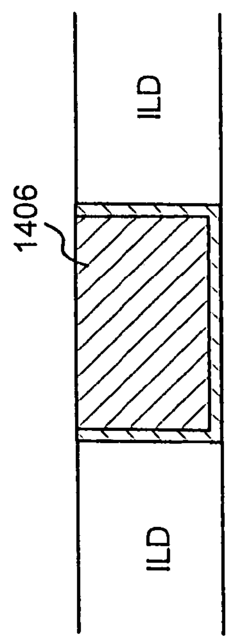

Referring to FIGS. 13 and 14, resist 1104 may be removed and a metal 1406 may then be selectively deposited. Metal 1406 may be deposited through selective electroless deposition and may include metals such as cobalt (Co), nickel (Ni), or tungsten (W) or their alloys. The metal 140 may be deposited only on the areas cultivated with implantation material 1205 (i.e., the activated surfaces of via 1103). Accordingly, via 1103 is filled with a conducting metal. This process tends to prevent CMP induced dishing or other detrimental effects.

CONCLUSION

A FinFET created using multiple gate layers to improve planarization is described herein. The multiple gate layers may include a thin amorphous silicon layer that acts as an automated planarization stop layer during the CMP process.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device comprising:

a fin formed over an insulator, the fin including first and second ends, at least a portion of the fin acting as a substantially vertical channel in the semiconductor device;

an amorphous silicon layer formed over at least a portion of the fin;

a polysilicon layer formed around at least the portion of the amorphous silicon layer, the amorphous silicon layer protruding through the polysilicon layer in an area over the fin;

a source region connected to the first end of the fin; and a drain region connected to the second end of the fin.

2. The semiconductor device of claim 1, wherein the semiconductor device is a FinFET.

3. The semiconductor device of claim 1, wherein the amorphous silicon layer is approximately 300 Å thick in the area over the fin.

4. The semiconductor device of claim 1, wherein the amorphous silicon layer and the polysilicon layer form a gate material layer for the semiconductor device.

5. The semiconductor device of claim 1, further comprising:

a dielectric layer formed around the fin.

6. The semiconductor device of claim 5, wherein the dielectric layer is approximately 50–100 Å thick.

7. The semiconductor device of claim 1, wherein the insulating layer includes a buried oxide layer formed on a silicon substrate.

8. The semiconductor device of claim 1, wherein the amorphous silicon layer is formed to protrude through the polysilicon layer by planarizing the semiconductor device using a chemical mechanical polishing (CMP) slurry that tends to planarize the amorphous silicon layer at a rate slower than that of the polysilicon silicon layer.

9. The semiconductor device of claim 8, wherein the planarization is performed using a slurry that include silica colloidal abrasives, with high selectivity to oxide and a pH ranging between 7 and 12.

10. The semiconductor device of claim 9, wherein the slurry is selected such that the planarization rate of the amorphous silicon layer is between 50 and 2000 Å per minute and the planarization rate of the polysilicon layer is between 500 to 6000 Å per minute.

* * * * *